(12) United States Patent  
Chan (10) Patent No.: US 7,515,973 B2  
(45) Date of Patent: Apr. 7, 2009

(54) METHOD AND SYSTEM FOR MODELING OF MAGNET CRYOGEN COOLER SYSTEMS

(75) Inventor: Peter Chan, Hartland, WI (US)

(73) Assignee: GE Medical Systems, Inc., Waukesha, WI (US)

( * ) Notice: Subject to any disclaimer, the term of this patent is extended or adjusted under 35 U.S.C. 154(b) by 1172 days.

(21) Appl. No.: 10/723,938

(22) Filed: Nov. 26, 2003

(65) Prior Publication Data

US 2005/0109049 A1  May 26, 2005

(51) Int. Cl.
- G05B 11/01 (2006.01)
- G01B 3/44 (2006.01)
- G01B 3/52 (2006.01)
- G06F 15/00 (2006.01)
- G06F 17/40 (2006.01)

(52) U.S. Cl. .................... 700/21; 702/34; 702/187; 702/188

(58) Field of Classification Search ................... 700/21; 702/34, 187–188
See application file for complete search history.

(56) References Cited

U.S. PATENT DOCUMENTS

| | | | | |
|---|---|---|---|---|
| 6,972,565 | B2 * | 12/2005 | Yokoi et al. | 324/307 |
| 7,127,371 | B2 * | 10/2006 | Duckert et al. | 702/179 |
| 2004/0215490 | A1 * | 10/2004 | Duchon et al. | 705/2 |

* cited by examiner

*Primary Examiner*—Ronald D Hartman, Jr.
(74) *Attorney, Agent, or Firm*—Fletcher Yoder (57) ABSTRACT

According to one embodiment, the present technique provides a method for servicing an imaging device having a cryogenic cooling system. In the exemplary embodiment, servicing of an MRI scanner may be scheduled via a model correlating a measured condition of the MRI scanner's cryogenic cooling system to a kind of imaging device event. According to another embodiment, the present technique provides a method for developing a model for predicting a cryogenic cooling system event by analyzing data from a population of similar cryogenic cooling systems.

27 Claims, 5 Drawing Sheets

METHOD AND SYSTEM FOR MODELING OF MAGNET CRYOGEN COOLER SYSTEMS

BACKGROUND OF THE INVENTION

The present technique relates to medical imaging devices and, more particularly, to imaging devices with cryogenic cooling systems.

A number of important applications exist for superconductive magnet systems. These include imaging systems, as for medical imaging, as well as spectrometry systems, typically used in materials analysis and scientific research applications. The present technique relates to management of cryogenically cooled superconductive magnets, and particularly to the servicing of such systems. Although reference is made throughout the following discussion to imaging systems, it should be borne in mind that the technique is applicable to a range of systems that utilize cryogenically cooled superconducting magnets.

Imaging devices are omnipresent in typical medical environments. Medical practitioners, such as physicians, may employ medical imaging devices to diagnose patients. Imaging devices, such as Magnet Resonance Imaging (MRI) devices and Nuclear Magnetic Resonance (NMR) devices, produce detailed images of a patient's internal tissues and organs, thereby mitigating the need for invasive exploratory procedures and providing valuable tools for identifying and diagnosing disease and for verifying wellness.

Typical MRI and NMR devices develop diagnostic images by affecting gyro-magnetic materials within a patient via controlled gradient magnetic fields and radiofrequency pulses in the presence of a main magnetic field developed by a superconductive magnet. During an MRI exam, a main magnetic field of upwards of two Tesla may be necessary to produce vivid images. Typically, superconductive electromagnets comprise loops of coiled wire, which are continuously bathed in a cryogen, such as liquid helium, at temperatures near absolute zero—approximately at 4 K or -271 C. When cooled to such extreme temperatures, the coiled wire becomes superconductive, i.e., the electrical resistance of the wire falls to essentially zero, enhancing the field strength without requiring significant energy input for continued operation. Advantageously, superconductive electromagnets reduce the electrical load requirements for producing the desired magnetic fields, thereby making the MRI system more economical to operate.

Cryogenic liquids, such as liquid helium, however, are relatively expensive to produce and maintain. Moreover, because of its low boiling point, liquid helium is a volatile liquid that transitions into a gaseous phase at relatively low temperatures. Accordingly, to conserve helium, typical MRI devices include a cryogenic cooling system, which recondenses volatilized helium back into its liquid phase. That is, the helium is maintained in a sealed helium vessel that provides gaseous helium to the cooling system and receives liquid helium from the cooling system in a closed loop process.

However, from time to time, the cryogenic cooling system may require maintenance and/or replacement. For example, the performance of the cryogenic cooling system's components may degrade, thereby reducing the efficacy of the cryogenic cooling system. Moreover, leaks within the helium vessel and/or cooling system, again for example, may also reduce the efficacy of the cooling system. During maintenance, it may become necessary to disengage the cryogenic cooling system and/or deactivate the MRI device, events that are to be avoided. If the cryogenic cooling system is off-line or not cooling effectively, more of the liquid helium may begin to volatilize, leading to an increase of pressure in the helium vessel. To prevent adverse effects due to the increased pressure, traditional MRI devices may relieve pressure by venting some of the gaseous helium to the atmosphere. The conversion of liquid helium to its gaseous state is generally known in the industry as "boil-off," and, venting of the gas leads to permanent loss expensive cryogen, requiring periodic refilling of the system.

To at least partially remedy these drawbacks of traditional systems, approaches have been developed for cooling superconductive magnets that are sometimes referred to as "zero boil-off" systems. In such systems a refrigeration system or "cold head" essentially runs continuously to recondense vaporized cryogen. An electric heater in the vessel then heats the cryogen to maintain a desired pressure level, thereby preventing the vessel pressure from falling below a desired level that could result in drawing atmospheric gases into the vessel. A balance is maintained between cooling and heating components that can be continuously monitored.

Traditionally, the maintenance of cryogenic cooling systems in MRI devices is a reactive process. That is, technicians are generally called when, for example, image quality has been affected, a critical indicator has activated, and/or the system is no longer operable. For example, a typical system may generate a service call when a low level of cryogen is detected due to venting or leaks in the system. In addressing concerns reactively, the repair time and/or off-line periods may be longer than desired. For example, certain parts and/or technicians may not be immediately available, leading to longer than necessary downtimes (i.e., off-line time). Moreover, periods of reactive maintenance may not coincide with already scheduled routine maintenance procedures, leading to duplicative downtimes for the MRI device. Similarly, when substantial quantities of cryogen are required, very significant costs may be incurred in refilling the serviced system.

Similar problems exist even prior to the time such magnets are placed in operation. For example, magnets are typically built and tested in a controlled factory environment, then at least partially disassembled from other support equipment for shipping. Current procedures for building, testing and shipping superconductive magnets do not, however, adequately accommodate boil-off or servicing needs. In much the same way, mobile MRI systems and systems where communications infrastructures are less available pose particular challenges beyond those of traditional fixed locations in hospitals. Such challenges include cryogen monitoring and servicing, but also location and identification of the systems, and communication of relevant parameter data to a monitoring or service-coordinating location.

Accordingly, there is a need for an improved technique for maintaining cryogenic cooling systems. Particularly, there is a need for a technique that reduces maintenance times, periods of deactivation, costs, and so forth.

BRIEF DESCRIPTION OF THE INVENTION

According to one embodiment, the present technique provides a method for servicing an imaging device having a cryogenic cooling system. The method includes receiving data representative of at least one condition of the cryogenic cooling system and receiving a second set of data correlative of the at least one condition of the cryogenic cooling system to a particular imaging device event. Once the data is received, the exemplary method includes developing a projection regarding the future occurrence of the imaging device event in the imaging device via the data received.

According to another embodiment, the present technique provides a method for developing a probabilistic model of a cryogenic cooling system event. The exemplary method includes collecting condition data related to at least one cryogenic cooling system. However, collecting condition data from a plurality of cryogenic cooling system is also envisaged. Once collected, the method includes analyzing the condition data to produce correlated data correlating the condition data to an occurrence of a cryogenic cooling system event in the at least one cryogenic cooling system. The method also includes developing a model for providing a projection of a future occurrence of the cryogenic cooling system event in a further cryogenic cooling system based upon the correlated data and a second set of condition data from the further cryogenic cooling system. Advantageously, the future occurrence of a cryogenic cooling system event in the further cryogenic cooling system may be predicted based upon the occurrence of the cryogenic cooling system event in previous cryogenic cooling systems.

According to yet another embodiment, the present technique provides a computer program for servicing a cryogenic cooling system. The computer program includes a code for receiving data representative of a condition of the cryogenic cooling system. Additionally, the computer program includes a code for determining a probabilistic occurrence of a cryogenic cooling system event in the cryogenic cooling system via a model and the data representative of the condition of the cryogenic cooling system.

DETAILED DESCRIPTION OF SPECIFIC EMBODIMENTS

Figure 1:
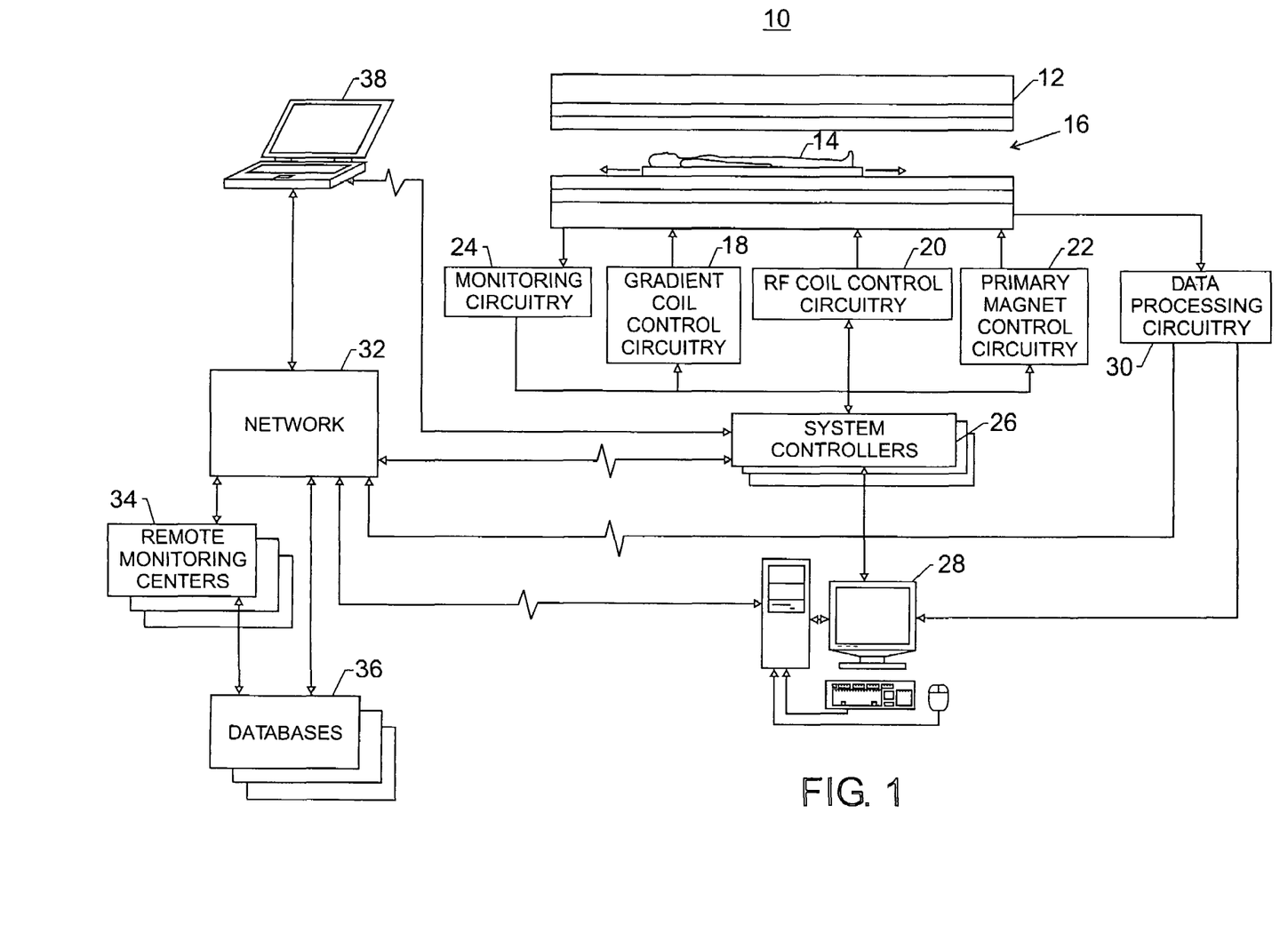
FIG. 1 is a diagrammatical representation of an exemplary imaging network having features in accordance with the present technique.

Turning to the drawings, FIG. 1 illustrates an exemplary imaging network 10. Although described with respect to a medical imaging device, it should be note that the present technique may be applied to any number of systems or devices that employ a cryogen for cooling, such as spectroscopy systems, nuclear accelerators, biological cooling facilities, and power transmission systems, to name but a few. The exemplary imaging network 10 includes a magnetic resonance imaging MRI scanner 12.

To obtain diagnostic images of a patient 14, a medical professional may direct the patient 14 into a patient bore 16 of the MRI scanner 12. A main magnetic field (i.e., 0.5-2.0 Tesla) is generally present in the patient bore 16. This field, as discussed further below, is produced by a superconductive electromagnet (see FIG. 2) disposed circumferentially about the patient bore 16. The superconductive electromagnet is part of a cryogenic cooling system that maintains superconducting temperatures in the magnet (e.g., 1-5 degrees Kelvin) to reduce the electrical resistance in the magnet coils to substantially zero. Advantageously, the superconductive nature of the electromagnet reduces the electrical requirements for producing the magnetic field, thereby making the MRI scanner 12 more economical to operate. It should be noted that, while in the present description reference is made to a horizontal cylindrical bore imaging system employing a super conducting primary field magnet assembly, as discussed below, the present technique may be applied to various other configurations, such as scanners employing vertical fields generated by super conducting magnets, permanent magnets, electromagnets or combinations of these means. Additionally, to manipulate the main magnetic field and to obtain diagnostic images, the MRI scanner 12 includes gradient magnets or coils, and radio frequency (rf) coils (not shown), both of which may be of generally known construction.

Operation of the MRI scanner 12 may be controlled and/or monitored by any number of control and monitoring circuits. By way of example, the gradient coils, the rf coils, and the main magnet may be controlled by gradient coil control circuitry 18, rf coil control circuitry 20, and main magnet control circuitry 22, respectively. Moreover, as discussed further below, various operations and conditions of the MRI scanner 12 may be monitored by monitoring circuitry 24.

Certain of these control and monitoring circuits may function under the direction of one or more system controllers 26, such as the heater controller and cooling system controller discussed further below. The system controller may include any suitable programmable logic device, such as a CPU or a digital signal processor of a general purpose or application. The system controller also may include memory circuitry, such as volatile and non-volatile memory devices, for storing physical and logical axis configuration parameters, examination pulse sequence descriptions, acquired image data, programming routines, and so forth, used during the examination sequences implemented by the scanner. Advantageously, the system controllers 26 may permit some amount of adaptation or configuration of the examination sequence by means of an operator interface 28. The operator interface 28 may be a computer terminal that provides a graphical user interface (GUI) to an individual for the receipt of information from and the input of commands to the MRI scanner 12.

Additionally, the exemplary MRI scanner 12 is coupled to data processing circuitry 30, which receives the detected imaging signals and processes the signals to obtain data for image reconstruction. In the exemplary MRI scanner 12, the data processing circuitry 30 digitizes the received signals and performs a two-dimensional fast Fourier transform on the signals to decode specific locations in the selected slice from which the received signals originated, thereby producing image data representative of the patient's internal tissue and organs, or more generally, features of interest of a subject. The resulting image data may be forwarded to the operator interface 28 for viewing. The image data may also be sent to a remote data repository for storage, as discussed further below. Advantageously, the data processing circuitry 30 may perform a wide range of other functions, such as image enhancement, dynamic range adjustment, intensity adjustment, smoothing, sharpening, and so forth. However, it should be appreciated that such functions may also be performed by software and/or hardware included in the operator interface 28 as well as at remote locations, which are discussed further below.

In many instances, the MRI scanner 12 may communicate with remote locations and devices via a network 32, such as a Local Area Network (LAN), a Server Area Network (SAN), a Metropolitan Area Network (MAN), a Wide Area Network (WAN), a Virtual Private Network (VPN), the Internet, or any other suitable kind of network. Communications over the network 32 may be conducted via any number of communications schemes and protocols, such as Global Standard for Mobile (GSM), Time Division for Multiple Access (TDMA), Code Division Multiple Access (CDMA), Frequency Division Multiple Access (FDMA), radio frequencies (rf), or any other suitable communications techniques. By way of example, the imaging network 10 may include remote monitoring centers 34, which may receive operation data and imaging data from the MRI scanner 12 via the network 32. Advantageously, the remote monitoring centers 34, via the network 32, may improve the image data quality as well as monitor and adjust the operating parameters remotely.

The network 32 may also facilitate access to remote databases 36. Advantageously, the remote databases 36 may store large volumes of image data and operating data from a wide variety of sources coupled to the network. That is, data from multiple MRI scanners 12 and patients 14 may be stored in a central location. Indeed, image or operating data may be accessed by user interfaces 28 at locations remote from the imaging scanner 12.

In certain instances, a field technician may wish to access data or operating parameters from the MRI scanner 12. Accordingly, a field unit 38, such as a laptop computer or hand-held device, may be linked to the system controllers 26. To improve portability, the field unit 38 may be configured to communicate with the system controllers 26 via a wireless protocol, such as IEEE 802.11(b), Bluetooth, or rf communications. Advantageously, the field technician, via the field unit 38, may be able to monitor operations of the MRI scanner 12 and provide system adjustments in response, to improve the quality of the images produced. Of course, the field unit 38 may also communicate with the imaging scanner 12 via the network 32.

Figure 2:
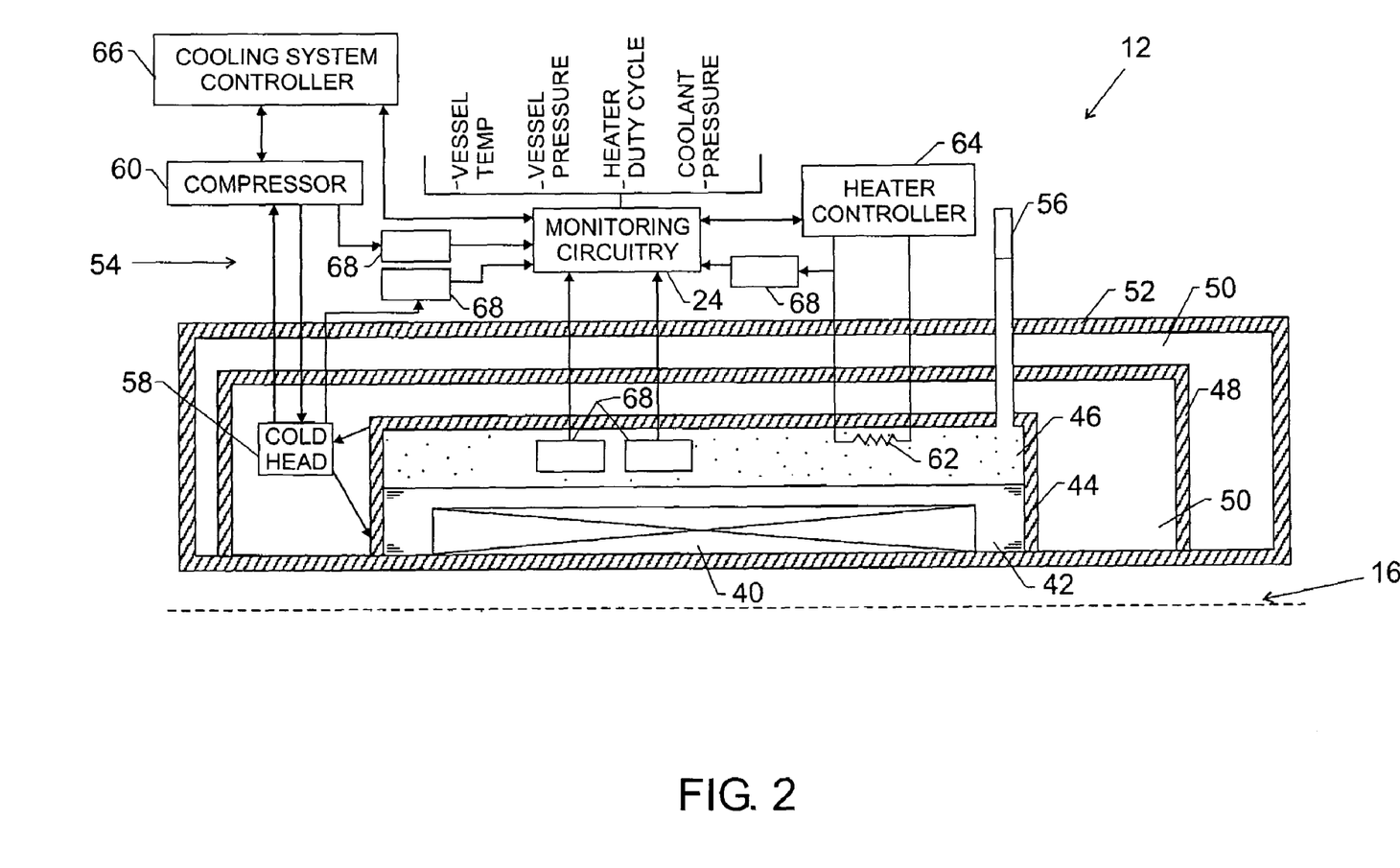
FIG. 2 is a partial cross-sectional view of an exemplary cryogenically cooled imaging device having features in accordance with the present technique.

Turning to FIG. 2, a partial cross-sectional view of an MRI scanner 12 is presented. Only an upper portion (i.e., above the centerline) of the exemplary, tubular MRI scanner 12 is illustrated. Because of the tubular design, the lower portion is similar to the upper portion, and, as such, the lower portion is not separately discussed. Additionally, it should be noted that, although a tubular scanner structure is described here, other geometries of magnets are known and presently in use, and can benefit from aspects of the present technique. For example, split imaging systems are known, in which an imaging volume is defined between two separated magnet sections. The sections are typically positioned either one above the other, or in a side-by-side arrangement. In either case the superconductive magnet may be part of a cryogenic cooling system, which may be maintained and serviced as described below. As discussed above, the MRI scanner 12 maintains a main magnetic field of approximately 0.5 to 2.0 Tesla in the patient bore 16. To produce the main magnetic field, the exemplary MRI scanner 12 includes a magnet 40 located towards the center of the MRI scanner 12 and disposed circumferentially about the patient bore 16. The main magnet is an electromagnet formed of loops of coiled wire. Routing electrical current through the coiled wire produces a magnetic field. To reduce the electrical load necessary to produce the desired main magnetic field, the exemplary electromagnet may be cooled to a superconductive state.

To transition the electromagnet to a superconductive state, the electromagnet 40 may be bathed in a cryogen, such as liquid helium 42, contained in a helium vessel 44, which circumscribes the patient bore 16 and surrounds the electromagnet 40. The liquid helium cools the electromagnet to superconductive temperatures (e.g., −271 C or 4 k). At superconductive temperatures, the electromagnet 40 (i.e., the loops of coiled wire) conducts electrical current essentially free of electrical resistance. Of course, the particular temperature at which the magnet materials transition to a superconducting state may vary depending upon the material used, and the specific temperature is not a limitation of the present technique. Advantageously, a relatively strong magnetic field (0.5-2.0 Tesla) may be produced at lesser electrical loads in comparison to traditional magnets, thereby reducing the operating costs of producing and maintaining the magnetic field. Other field strengths are, of course, possible, with spectroscopy and other systems obtaining significantly higher flux densities.

Liquid helium 42, similar to other cryogens, vaporizes into a gaseous state (i.e., gaseous helium 46) at relatively low temperatures (e.g., liquid helium boils at 4.2 K under standard pressure conditions). Accordingly, to insulate the helium 42 and 46 from external heat sources, the helium vessel 44 may be surrounded by a radiation heat shield 48. Advantageously, a vacuum region 50 located between the helium vessel 44 and the heat shield 48, as well as between the heat shield 48 and an outer housing 52 of the MRI scanner 12 may further insulate the helium vessel 44 from external heat sources.

Furthermore, as also discussed below, the vaporization of the liquid helium 42 typically increases the pressure in the helium vessel 44. Accordingly, the helium vessel 44 may be coupled to a vent or relief valve 56. In the present embodiment, for example, should pressure in the helium vessel 44 reach or exceed a desired operating pressure (e.g., 4 psi), the vent may release excess helium 46 to relieve the pressure. However, because helium is relatively expensive, the venting of the helium is to be avoided.

To conserve helium, the helium vessel 44 is part of a cryogenic cooling system 54, which recondenses gaseous helium 46 back into its liquid phase 42. In the exemplary MRI scanner 12, the cryogenic cooling system 54 includes a cold head 58 coupled to a compressor 60. As appreciated by those skilled in the art, the compressor 60 pressurizes a coolant, such as liquid nitrogen, and circulates the coolant to the cold head 58. By allowing the coolant to decrease in pressure, fins (not shown) in the cold head 58 may be cooled to the condensation point of the cryogen, that is, a low enough to cause the gaseous helium 46, for example, to return to its liquid phase. In a cyclical manner, the gaseous helium 46 is routed from the vessel, in the cold head 58, and across the fins. The fins, which are to cooled to approximately 2-4 K, condense the helium into its liquid phase, and the recondensed liquid helium 42 is routed back into the helium vessel 44, thereby conserving the helium in the vessel 44 and producing equilibrium between the liquid and gaseous phases of the helium.

During operation of the MRI scanner 12, it may be advantageous to maintain the pressure within the helium vessel 44 within predetermined parameters, e.g., 4.0 to 4.3 psi. However, if, for example, the equilibrium in the helium vessel 44 is biased towards the liquid phase of the helium by the cold head 58, the helium vessel 44 may reach a negative pressure condition allowing atmospheric gases to be drawn into the vessel 44. If atmospheric gases enter the helium vessel 44, water vapor in the atmosphere may freeze, causing clogs in the cooling system that degrade the performance and, in certain instances, leading to the failure of the cryogenic cooling system 54 and/or the MRI scanner 12. Thus, to increase the pressure (i.e., increase the pressure to a positive pressure condition), a heating element 62, such as a resistive heating element, is located in the helium vessel 44. As discussed further below, while the cold head 58 operates substantially continuously, power to the heating element 62 cycles to maintain equilibrium within the vessel 44. The operating periods of the heating element 62 may be referred to as the heater duty cycle. In a present embodiment, power to the heating element 62 is controlled in a closed-loop manner based upon pressure detected within the vessel, to maintain the pressure between desired minimum and maximum levels.

Alternatively, if, for example, the equilibrium is biased towards the gaseous phase by the cold head 58 operating inefficiently or by external heat sources, the pressure in the vessel 44 may increase, leading to an undesired venting of helium and/or degradation in image quality. As discussed further below, if a high-pressure condition is detected, a cooling system controller 66 may optimize and adjust operation of the cooling system 54 to bias the equilibrium of the helium towards the liquid phase, thereby reducing the pressure in the vessel 44.

To monitor operation of the MRI scanner 12, a plurality of sensors 68 may be located throughout the MRI scanner 12, and particularly on or in the main magnet structures and support systems. For example, temperature and pressure sensors, collectively indicated generally by reference numeral 68, located in the vessel 44 may monitor conditions in the helium vessel 44. Additionally, other sensors 68 may monitor certain components in the cryogenic cooling system 54 (e.g., the cold head 58 and the compressor 60). Similarly, yet other sensors 68 may monitor the heating components of the cryogenic cooling system 54 (e.g., the heating element 62). Of course, there may be any number of sensors 68 located throughout the MRI scanner 12 for monitoring any number of conditions related to any number of systems and components of the MRI scanner 12.

The various sensors 68 throughout the system may provide operational data regarding the MRI scanner 12 to the monitoring circuitry 24. Moreover, the heater controller and the cooling system controller may also provide data to the monitoring circuitry 24. By way of example, the monitoring circuitry 24 may receive and process data regarding the temperature within the vessel, the pressure within the vessel, the heater duty cycle, coolant pressure within the cooling system, or a host of any other operating conditions regarding the MRI scanner. Advantageously, the monitoring circuitry 24 may be configured to communicate the processed and received information to the network 32 as well as to the user interface 28 (see FIG. 1).

From time to time, the MRI scanner 12 may require maintenance. For example, the cold head 58 may begin to lose efficacy, the imaging coils may require calibration, the image quality may deteriorate due to a range of factors, the filter may require cleaning, to name but a few types of service maintenance. Moreover, the level of helium 42 may decline to undesirable levels and/or may reach undesirable temperatures, at which the magnet 40 may lose superconductivity. Accordingly, as mentioned above, servicing of these systems of the MRI scanner 12 may be required. Service maintenance, however, may require taking the MRI scanner 12 offline, leading to undesirable and potentially costly downtime. Additionally, the MRI scanner 12 may require routine maintenance, such as calibration and testing, to sustain effective operations. Routine maintenance is typically conducted at predetermined intervals. Routine maintenance, too, may require taking the MRI scanner 12 offline. In general, offline times of the MRI scanner 12 are to be minimized.

Figure 3:
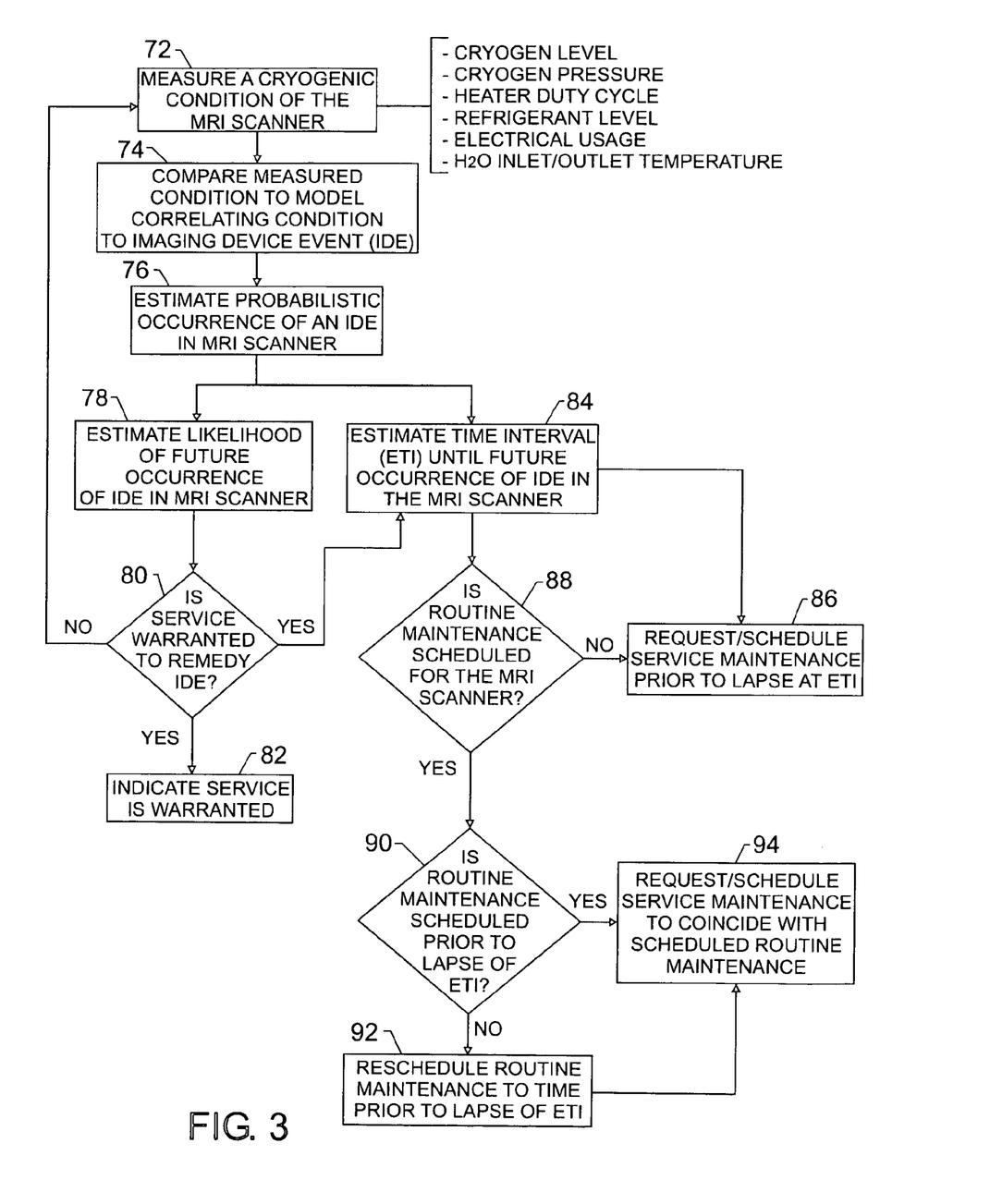
FIG. 3 is a flow chart of an exemplary process for servicing a cryogenically cooled imaging device in accordance with aspects of the present technique.

To minimize offline time of the MRI scanner 12, an exemplary process for requesting and scheduling maintenance of the MRI scanner 12 may be employed, as graphically illustrated in FIG. 3. The exemplary maintenance scheduling process is referred to generally as numeral 70. The method includes measuring a condition of the cryogenic cooling system 54 of the MRI scanner 12, as represented by block 72. As discussed above, the various sensors 68 (see FIG. 2) throughout the MRI scanner 12 may collect data regarding any number of conditions. That is, the sensors 68 may measure both operational and quiescent conditions of the cryogenic cooling system 54. Moreover, the sensor may obtain data regarding conditions of other systems and components of the MRI scanner as well. By way of example, the sensors 68 may provide data regarding the cryogen levels, the cryogen pressure, the heater duty cycles, the refrigerant levels, the electrical consumption, and water inlet and outlet pressures, among a host of other conditions of the MRI scanner 12.

In the exemplary method, a probabilistic model, as discussed further below, may correlate the measured conditions of the cryogenic cooling system 54 to an imaging device event, as represented by block 74. That is, the model may compare and correlate the measured condition of the cryogenic cooling system to a particular kind of imaging device event, such as failure of the cold head 58 (see FIG. 2) and/or loss of superconductivity, to name but a few types of imaging device events. That is, the model may contain distilled statistical information correlating the present measured condition of the cryogenic cooling system 54 to a future event, occurrence, and/or condition in the MRI scanner 12 (see FIG. 2). For example, the model may be employed to estimate aspects of the possible occurrence of the imaging device event in the MRI scanner 12 based upon the presently measured conditions of the cryogenic cooling system 54, as represented in the exemplary method as block 76.

It should be understood that the exemplary model may be accessed and executed at various locations. For example, the model may be located on the mobile device 38 of a field technician. By accessing the MRI scanner 12 via the network 32, the field technician may receive real-time condition data of the MRI scanner 12. Accordingly, the field technician may develop the appropriate schedules (i.e., routine and service maintenance schedules) remotely at the mobile device 38. Moreover, the model may be located and run at the remote monitoring centers 34. Again, the remote monitoring centers 34 may obtain real-time condition data from the MRI scanner 12 via the network 34. Furthermore, the model may be accessed and located locally at the user interface 28 or system controllers 26.

As one example, the model may estimate the likelihood of a loss of superconductivity occurring in the MRI scanner 12 (see FIG. 2), as represented by block 78. To accomplish this, the model may receive condition data regarding the cryogenic cooling system and, based on the condition data and the statistical information incorporated into the model, determine that the likelihood of a loss of superconductivity in the magnet is low, i.e., statistically insignificant. If so, the model may suggest continued monitoring of the MRI scanner 12, as represented by block 80. However, as also represented by block 80, the model, may determine that the likelihood of the loss of superconductivity is statistically significant. If so, the model may suggest action, as discussed further below. This need for action may be communicated to the appropriate authority, as represented by block 82.

Additionally, the model may determine and rank the likelihood of the multiple types of imaging device events occurring concurrently or at various intervals. Advantageously, establishing a hierarchy between the likelihood of various imaging device events occurring may assist in the maintenance of an MRI scanner. For example, a field technician and/or an operator may keep an inventory of parts for addressing the more likely imaging device events, thereby shortening downtimes caused by certain logistical complications related to maintenance, e.g., overseas shipment of parts and/or production lead time for replacement parts.

Additionally, the model may estimate a time interval until probabilistic occurrence of the imaging device event in the MRI scanner 12, as represented by block 84. That is, the model may estimate the time interval until a future occurrence of imaging device event in the MRI scanner 12 based on the present condition data from the cryogenic cooling system 54 of the MRI scanner 12 and the statistical information incorporated into the model. For example, as discussed further below, the model may determine that the cold head 58 (see FIG. 2) is likely to fail in one month based upon comparisons of the present heater duty cycle of the MRI scanner 12 (see FIG. 2) and statistical information correlating heater duty cycles to cold head 58 failure incorporated in the model. Accordingly, replacement of the cold head 58 may be scheduled in advance. That is, replacement of the cold head 58 may be scheduled for a date prior to lapse of the predicted one month time interval until failure, as represented by block 86. Rather then reactively replacing the cold head 58 upon failure, the cold head 58 may be replaced proactively based upon the predicted time interval until failure. Advantageously, such proactive maintenance can reduce delays due to unavailable parts and/or technicians, for example.

In certain instances, the MRI scanner 12 may be scheduled for routine maintenance, as represented by block 88. Routine maintenance is typically scheduled at predetermined intervals. For example, routine maintenance, such as filter replacements, may be scheduled at six-month intervals from one another. Moreover, routine maintenance may be scheduled at usage intervals, e.g., replacing filters following a predetermined number of images taken or examinations preformed. During routine maintenance, it may be necessary to take the MRI scanner 12 off-line, i.e., interrupt normal usage of the system. Accordingly, it may be advantageous to coordinate the schedules of the routine maintenance and the service maintenance.

For example, if the routine maintenance is scheduled to occur after lapse of the estimated time interval until future occurrence the imaging device event in the MRI scanner 12 (see FIG. 2), the routine maintenance may be rescheduled to better coincide with the service maintenance, which is scheduled to occur prior to lapse of the time interval. Blocks 90 and 92 represent this step in the exemplary method. As one example, if the routine maintenance is scheduled to occur in two months, and the model estimates that cold head failure (i.e., the imaging device event) is likely to occur in one month, then the routine maintenance can be rescheduled to occur within the estimated one month window. That is, the routine maintenance and the service maintenance may be scheduled to occur concurrently and/or in an overlapping relationship with respect to one another to reduce the offline time of the MRI scanner 12.

Alternatively, if the routine maintenance is scheduled to occur prior to the lapse of the predicted time interval until the future occurrence of the imaging device event, then the service maintenance may be scheduled to coincide with the already scheduled routine maintenance. This step in the exemplary method is represented by block 94. Of course, even if the routine maintenance is scheduled to occur prior to lapse of the predicted time interval, it may be advantageous to reschedule the routine maintenance to coordinate with the scheduling of the service maintenance. Moreover, the present technique may be employed to coordinate various types of service maintenance. For example, if the predicted time interval until failure of the cold head 58 (see FIG. 2) is three months and the predicted time interval until failure of the rf coil is two months, then it may be advantageous to coordinate the service of both elements (i.e., the cold head 58 and the rf coil) within the shorter two month window. Indeed, the present technique provides a method by which serving and maintenance of an imaging device may be optimized by proactively servicing the device, rather than reactively servicing the device.

Figure 4:
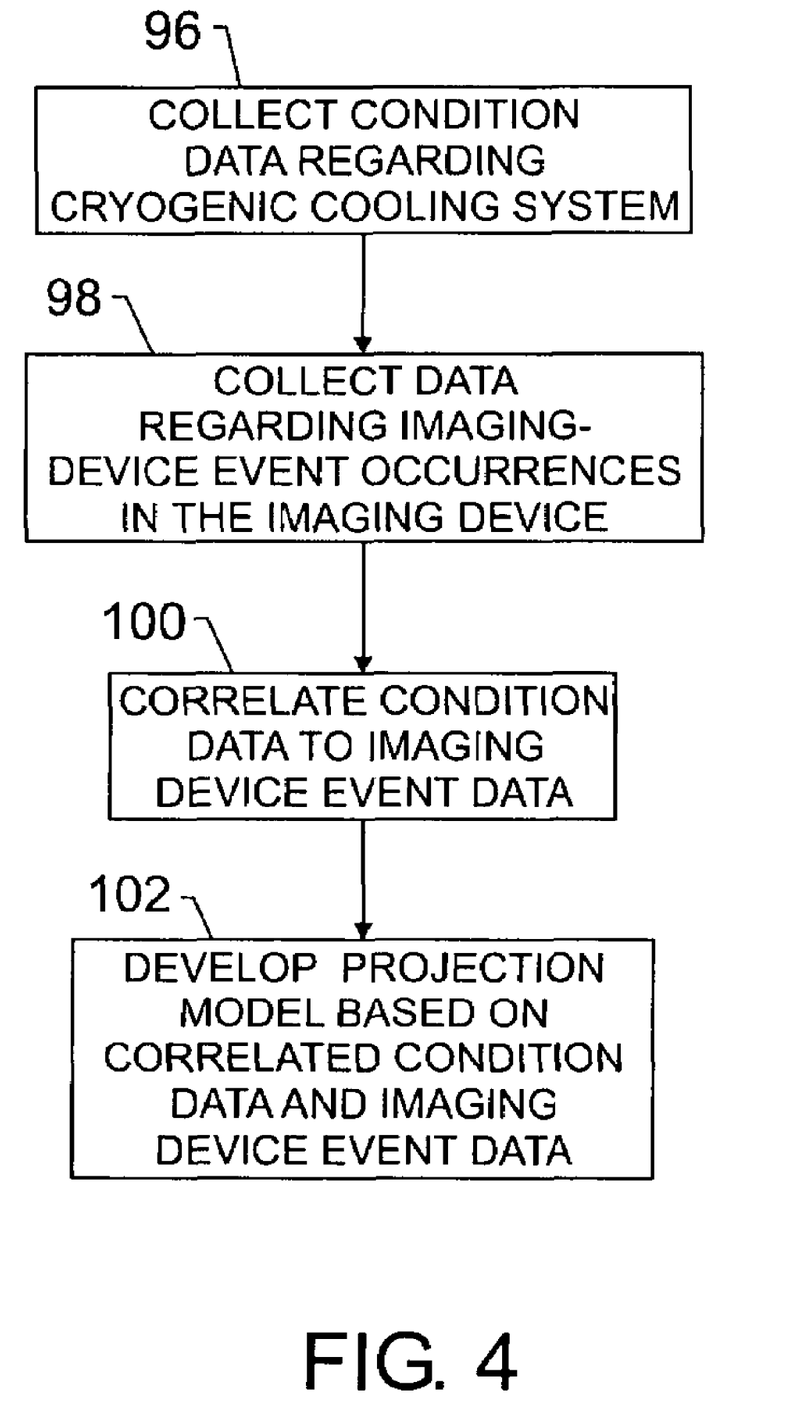
FIG. 4 is a block diagram of an exemplary process for developing a model for servicing a cryogenically cooled imaging device in accordance with aspects of the present technique.

Turning to FIG. 4, an exemplary method for developing the exemplary model is presented in graphical form. As represented by block 96, the exemplary method includes collecting condition data from cryogenic coding systems in a population of imaging devices. For example, condition data regarding the heat duty cycles may be collected from a population of MRI scanners. Moreover, data regarding the occurrences of particular types of imaging device events within the population of MRI scanners may be collected, as represented by block 98. This data may be collected remotely via a network and stored in remote databases, as discussed in FIG. 1. Of course, any number of data collection and storage techniques may be envisaged. Once collected, the condition data of the cryogenic cooling system and the imaging device event data may be correlated, as represented by block 100. By of example, the imaging device event data and the condition data of the cryogenic cooling system may be correlated via various types of statistical analyses and logic algorithms. Indeed, the correlation may be conducted by analyzing the data from the population of MRI scanners using regression analysis or multivariable analysis, which are known to those of ordinary skill in the art. Moreover, the correlated data may be distilled into a correlative factor linking the two types of data. The correlative factor (i.e., the factor correlating imaging device event data to the condition data) may be employed to develop a model for predicting and/or estimating aspects surrounding the possible occurrence of the imaging device event in a monitored MRI scanner, as represented by block 102. Advantageously, the exemplary model may be distilled down to an algorithm. Indeed, the model may be employed within a computer program for servicing imaging devices.

Figure 5:
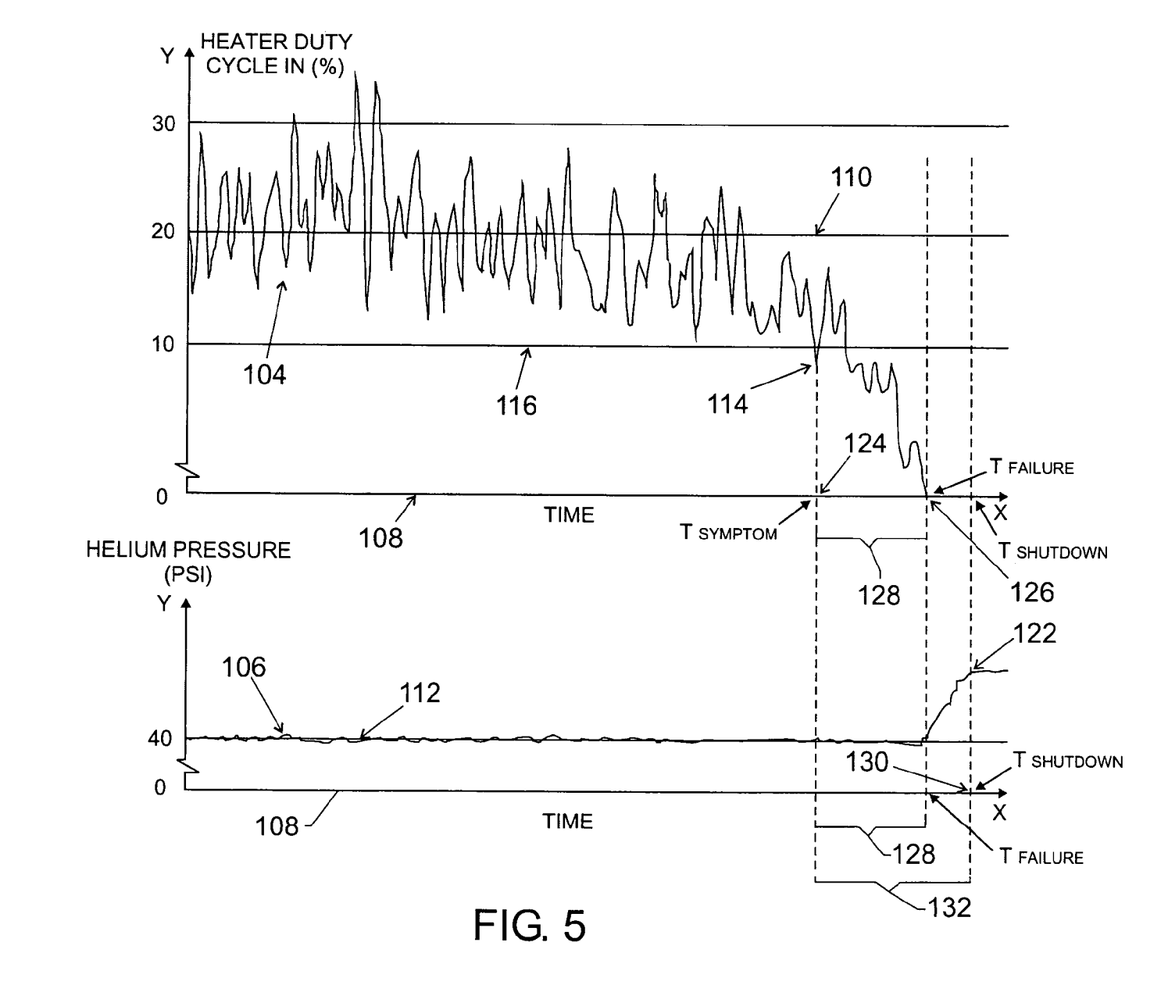
FIG. 5 is a graphical representation of an exemplary model for servicing a cryogenically cooled imaging device in accordance with aspects of the present technique.

Keeping FIGS. 1 and 2 in mind, FIG. 5 illustrates an exemplary model in graphical form. The exemplary model presents a heater duty cycle curve 104 of an exemplary MRI scanner over time and a helium pressure curve 106 (i.e., the pressure of the gaseous helium 46 in the helium vessel 44) of an exemplary MRI scanner over time. More specifically, FIG. 5 is a graphical representation of the heater duty cycle in percent (i.e., the percent of the time a heating element is energized) plotted versus time 106, which is plotted on the horizontal axis of the graph. Furthermore, FIG. 5 is a graphical representation of the helium pressure in psi plotted versus time 106, which, again, is plotted on the horizontal axis of the graph. As discussed further below, the exemplary model correlates the heater duty cycle (i.e., the measure condition) to the likelihood of cold head failure (i.e., the imaging device event). However, it should be noted that any number of models may be developed via the present technique, as exemplified herein with reference to FIG. 4. That is, any number of permutations and combinations of correlations between types of imaging device events and measured conditions may be modeled via the present technique. Moreover, a plurality of measured conditions may be correlated to a single imaging device event, again, for development of a model. However, for the purpose of simplifying explanation, only a model correlating the heater duty cycle to cold head failure is discussed.

As determined via statistical analysis, the exemplary model indicates that an average heater duty cycle of an MRI scanner should be approximately twenty percent, as represented by line 110. Moreover, the exemplary model indicates that at this average heater duty cycle (i.e., twenty percent) the helium pressure remains relatively constant, around 4.0 psi, as represented by line 112. However, the exemplary model also indicates that if the heater duty cycle falls below ten percent, as represent by point 114 on the curve 104 and line 116 on the graph, failure of a cold head is likely. Again, this correlation may be developed via various types of statistical analyses.

In the exemplary model, the failure or the near total failure of the cold head is represented by point 120 on curve 104. At this point, the heater duty cycle is zero. That is, because the cold head is no longer effectively cooling the gaseous helium 46, the heating element is no longer necessary to maintain the equilibrium discussed above. Accordingly, the helium pressure within a helium vessel may rise to a point at which super conductivity is lost, as represented by numeral 122. The loss of superconductivity may cause an MRI scanner to fail, leading to long downtimes and expensive repairs, again, as discussed above.

However, the exemplary model provides a probabilistic time interval between detection of a certain condition and predicted failure of an MRI scanner. In the exemplary model, the heater duty cycle falls below the ten percent threshold at time $T_{Symptom}$, represented by numeral 124. Also, in the exemplary model, near total failure of cold head occurs at time $T_{Failure}$, as represented by numeral 126. Accordingly, the exemplary model indicates that a diagnostic time interval 128 exists between $T_{Symptom}$ and $T_{Failure}$. By way of example, the exemplary model indicates that there is a likelihood of a cold head failure one month after the heater duty cycle falls below ten percent. That is, the diagnostic time interval 128 is one month. Moreover, the model indicates that a loss of superconductivity, leading to failure of an MRI scanner, is likely to occur at time $T_{Shutdown}$, as represented by numeral 130. Accordingly, the model may indicate a shutdown time interval 132 between $T_{Symptom}$ and $T_{Shutdown}$.

By employing the exemplary model, a future imaging device event in the monitored MRI scanner 12 may be predicted. That is, by mapping monitored conditions of the MRI scanner 12 against the model, an imaging device event may be predicted. For example, if the heater duty cycle in the monitored MRI scanner 12 falls below ten percent, and this condition is provided to the model, the model may determine that the likelihood of failure of the cold head 58 is relatively significant. Moreover, the model may indicate that failure of the cold head 58 is likely to occur within one month, the span of the diagnostic time interval 132. Accordingly, preparations for repair and/or replacement of the cold head 58 may be made in advance. That is, the service may be proactive. Indeed, lead-times for acquiring parts and skilled technicians may be satisfied prior to failure of the MRI scanner 12. Moreover, any routine maintenance scheduled for the MRI scanner 12 may be rescheduled to coincide with the service maintenance schedule via the model. This, too, may advantageously reduce downtimes of the MRI scanner 12.

While the invention may be susceptible to various modifications and alternative forms, specific embodiments have been shown by way of example in the drawings and have been described in detail herein. However, it should be understood that the invention is not intended to be limited to the particular forms disclosed. The present technique need not be limited to use with cryogenic cooling systems in imaging devices. Indeed, the present technique may be applied a host of devices including cryogenic cooling systems. For example, superconducting magnets, biological coolers, and so forth. Moreover, the invention is to cover all modifications, equivalents, and alternatives falling within the spirit and scope of the invention as defined by the following appended claims.

What is claimed is:

1. A method for servicing an imaging device having a cryogenic cooling system, comprising:
   receiving first data representative of at least one condition of the cryogenic cooling system;
   receiving second data correlative of the at least one condition to an imaging device event; and
   developing a projection regarding possible occurrence of the imaging device event with respect to the imaging device via the first and second data.

2. The method as recited in claim 1, comprising developing the projection via a model.

3. The method as recited in claim 1, comprising receiving data representative of a plurality of conditions of the cryogenic cooling system.

4. The method as recited in claim 1, comprising scheduling service for the imaging device based upon the projection.

5. The method as recited in claim 1, comprising requesting service of the imaging device based upon the projection.

6. The method as recited in claim 1, comprising estimating an interval of time until the possible occurrence of imaging device event in the imaging device via the projection.

7. A computer readable medium comprising code for servicing an imaging device having a cryogenic cooling system, the computer readable medium being located on one or more tangible media, comprising:
   code for receiving first data representative of at least one condition of the cryogenic cooling system;
   code for receiving second data correlative of the at least one condition to an imaging device event; and
   code for developing a projection regarding possible occurrence of the imaging device event with respect to the imaging device via the first and second data.

8. A service scheduling system for use with an imaging device having a cryogenic cooling system, comprising:
   means for receiving first data representative of at least one condition of the cryogenic cooling system;
   means for receiving second data correlative of the at least one condition to an imaging device event; and
   means for developing a projection regarding possible occurrence of the imaging device event with respect to the imaging device via the first and second data.

9. A method for servicing a cryogenic cooling system, comprising:
   receiving first data representative of at least one parameter related to the cryogenic cooling system;
   receiving second data correlating the first data to a model time interval related to a possible occurrence of a cryogenic cooling system event; and
   determining a probabilistic time interval until the possible occurrence of the cryogenic cooling system event in the cryogenic cooling system via the second data.

10. The method as recited in claim 9, comprising requesting service of the cryogenic cooling system such that the service occurs prior to lapse of the probabilistic time interval.

11. The method as recited in claim 9, comprising coordinating maintenance of a further system such that maintenance of the further system occurs prior to lapse of the probabilistic time interval.

12. The method as recited in claim 9, comprising coordinating routine maintenance of at least one of the cryogenic cooling system and a further system to occur prior to lapse of the probabilistic time interval.

13. The method as recited in claim 12, comprising coordinating service of the cryogen cooling system with the routine maintenance of at least one of the cryogenic cooling system and the further system.

14. The method as recited in claim 9, wherein the at least one parameter relates to a heating element of the cryogenic cooling system.

15. The method as recited in claim 9, wherein the at least one parameter relates to cryogen pressure with respect to the cryogenic cooling system.

16. A computer readable medium comprising code for servicing a cryogenic cooling system, the computer readable medium being located on one or more tangible media, comprising:
    code for receiving first data representative of at least one parameter related to the cryogenic cooling system;
    code for receiving second data correlating the first data to a model time interval related to a possible occurrence of a cryogenic cooling system event; and
    code for determining a probabilistic time interval until the possible occurrence of the cryogenic cooling system event in the cryogenic cooling system via the second data.

17. A service scheduling system for use with a cryogenic cooling system, comprising:
    means for receiving first data representative of at least one parameter related to the cryogenic cooling system;
    means for receiving second data correlating the first data to a model time interval related to a possible occurrence of a cryogenic cooling system event; and
    means for determining a probabilistic time interval until the possible occurrence of the cryogenic cooling system event in the cryogenic cooling system via the second data.

18. A method for developing a probabilistic model of a cryogenic cooling system event, comprising:
    collecting a first set of condition data from a population of cryogenic cooling systems;
    analyzing the first set of condition data to produce correlated data correlating the first set of condition data to occurrences of a cryogenic cooling system event in the population of cryogenic cooling system; and
    analyzing the correlated data to produce a model for providing a projection for a possible occurrence of the cryogenic cooling system event in a further cryogenic cooling system based upon the correlated data and a second set of condition data from the further cryogenic cooling system.

19. The method as recited in claim 18, wherein the condition data relates to a heater duty cycle at the cryogenic cooling system.

20. The method as recited in claim 18, wherein the cryogenic cooling system event is a loss of superconductivity in a magnet of the cryogenic cooling system.

21. The method as recited in claim 18, wherein the projection includes a time interval until the possible occurrence of the cryogenic cooling system event in the further cryogenic cooling system.

22. The method as recited in claim 21, comprising determining a maintenance schedule for the further cryogenic cooling system based upon the time interval until the possible occurrence of the cryogenic cooling system event in the further cryogenic cooling system.

23. A computer readable medium comprising code for developing a model for serving of a cryogenic cooling system, the computer readable medium being located on one or more tangible media, comprising:
    code for collecting a first set of condition data from a population of cryogenic cooling systems;
    code for analyzing the first set of condition data to produce correlated data correlating the first set of condition data to occurrences of a cryogenic cooling system event in the population of cryogenic cooling system; and
    code for analyzing the correlated data to produce a model for providing a projection for a possible occurrence of the cryogenic cooling system event in a further cryogenic cooling system based upon the correlated data and a second set of condition data from the further cryogenic cooling system.

24. A scheduling system for a cryogenic cooling system, comprising:
    means for collecting a first set of condition data from a population of cryogenic cooling systems;
    means for analyzing the first set of condition data to produce correlated data correlating the first set of condition data to occurrences of a cryogenic cooling system event in the population of cryogenic cooling system; and
    means for analyzing the correlated data to produce a model for providing a projection for a possible occurrence of the cryogenic cooling system event in a further cryogenic cooling system based upon the correlated data and a second set of condition data from the further cryogenic cooling system.

25. A method for developing a probabilistic model of an imaging device event in an imaging device having a cryogen cooling system, comprising:
    collecting a first set of data from a population of imaging devices, wherein the first set of data contains information regarding the condition of the cryogenic cooling systems of the population of the imaging devices;
    collecting a second set of data from the population of imaging devices, wherein the second set of data contains information regarding occurrences of imaging device events in the population of the imaging devices;
    analyzing the first and second sets of data to produce correlated data correlating the first and second sets of data; and
    analyzing the correlated data to produce a model for providing a projection of the possible occurrence of the imaging device event in a further imaging device based upon the correlated data and a third set of data from the cryogenic cooling system of the further imaging device.

26. A computer readable medium comprising code for developing a probabilistic model for servicing an imaging device having a cryogenic cooling system, the computer readable medium being located on one or more tangible media, comprising:
    code for collecting a first set of data from a population of imaging devices, wherein the first set of data contains information regarding the condition of the cryogenic cooling systems of the population of the imaging devices;
    code for collecting a second set of data from the population of imaging devices, wherein the second set of data contains information regarding occurrences of imaging device events in the population of the imaging devices;
    code for analyzing the first and second sets of data to produce correlated data correlating the first and second sets of data; and
    code for analyzing the correlated data to produce a model for providing a projection of the possible occurrence of the imaging device event in a further imaging device based upon the correlated data and a third set of data from the cryogenic cooling system of the further imaging device.

27. A scheduling system for an imaging device having a cryogenic cooling system, comprising:
- means for collecting a first set of data from a population of imaging devices, wherein the first set of data contains information regarding the condition of the cryogenic cooling systems of the population of the imaging devices;
- means for collecting a second set of data from the population of imaging devices, wherein the second set of data contains information regarding occurrences of imaging device events in the population of the imaging devices;
- means for analyzing the first and second sets of data to produce correlated data correlating the first and second sets of data; and
- means for analyzing the correlated data to produce a model for providing a projection of the possible occurrence of the imaging device event in a further imaging device based upon the correlated data and a third set of data from the cryogenic cooling system of the further imaging device.

* * * * *